(12) United States Patent
Peek et al.

(10) Patent No.: US 10,128,190 B2
(45) Date of Patent: Nov. 13, 2018

(54) SEMICONDUCTOR DEVICE AND METHOD OF MANUFACTURING SUCH SEMICONDUCTOR DEVICE

(75) Inventors: Hermanus Leonardus Peek, Geldrop (NL); Willem Hendrik Maes, Lommel (BE); Wilco Klaassens, Eindhoven (NL)

(73) Assignee: TELEDYNE DALSA B.V., Eindhoven (NL)

( * ) Notice: Subject to any disclaimer, the term of this patent is extended or adjusted under 35 U.S.C. 154(b) by 232 days.

(21) Appl. No.: 14/403,145

(22) PCT Filed: Apr. 23, 2012

(86) PCT No.: PCT/EP2012/057404
§ 371 (c)(1),
(2), (4) Date: Jul. 24, 2015

(87) PCT Pub. No.: WO2013/159807
PCT Pub. Date: Oct. 31, 2013

(65) Prior Publication Data
US 2015/0325519 A1 Nov. 12, 2015

(51) Int. Cl.
*H01L 23/538* (2006.01)
*H01L 27/148* (2006.01)
*H01L 27/146* (2006.01)
*H01L 23/535* (2006.01)
(Continued)

(52) U.S. Cl.
CPC .......... *H01L 23/538* (2013.01); *H01L 21/743* (2013.01); *H01L 21/76892* (2013.01);
(Continued)

(58) Field of Classification Search
CPC ............. H01L 23/538; H01L 21/76892; H01L 21/743; H01L 23/535
(Continued)

(56) References Cited

U.S. PATENT DOCUMENTS 5,504,355 A 4/1996 Hatano
6,878,919 B1* 4/2005 Nichols ............. H01L 27/14623
250/208.1
(Continued)

FOREIGN PATENT DOCUMENTS

KR 2002-0059120 7/2002

OTHER PUBLICATIONS

Peek et al.; "Grove-fill of Tungsten and poly-Si membrane technology for high performance (HDTV) FT-CCD imagers"; Electron Devices Meeting, 1993. Technical Digest., IEEE; pp. 567-570; Dec. 5, 1993.
(Continued)

*Primary Examiner* — Bo Fan
(74) *Attorney, Agent, or Firm* — Snell & Wilmer LLP

(57) ABSTRACT

The invention relates to a semiconductor device comprising: i) a substrate (1) comprising an insulating layer (2), wherein the electrically insulating layer (2) comprises a recess (99), and ii) a first conductive wire (20). The first conductive wire (20) comprises a first conductive sub-layer (22) provided within the recess (99), and comprises a second conductive sub-layer (24) provided on the first conductive sub-layer (22) forming a shunt for the first conductive sub-layer (22), wherein the first conductive sub-layer (22) comprises tungsten and the second conductive sub-layer (24) comprises aluminum, wherein the first conductive sub-layer (22) and the second conductive sub-layer (24) are substantially planar, and wherein the second conductive sub-layer (24) has substantially the same pattern as the first conductive sub-layer (22). The invention provides a semiconductor device, wherein the charge transport problem is improved, while ensuring a large packing density and a full flat-topology. This advantage is particularly useful in high-speed and/or high resolution image sensors.

7 Claims, 6 Drawing Sheets

(51) Int. Cl.
*H01L 21/74* (2006.01)
*H01L 21/768* (2006.01)
*H01L 23/532* (2006.01)

(52) U.S. Cl.
CPC ........ *H01L 23/535* (2013.01); *H01L 23/5386* (2013.01); *H01L 23/53214* (2013.01); *H01L 23/53257* (2013.01); *H01L 27/14643* (2013.01); *H01L 27/14806* (2013.01); *H01L 27/14812* (2013.01); *H01L 21/7682* (2013.01); *H01L 21/76849* (2013.01); *H01L 27/14603* (2013.01); *H01L 27/14623* (2013.01); *H01L 27/14636* (2013.01); *H01L 2924/0002* (2013.01)

(58) Field of Classification Search
USPC .......................................... 600/459; 257/231
See application file for complete search history.

(56) References Cited

U.S. PATENT DOCUMENTS

| | | | | |
|---|---|---|---|---|
| 2007/0066902 | A1* | 3/2007 | Wilser | A61B 8/12 600/459 |
| 2007/0099358 | A1* | 5/2007 | Sung | H01L 21/743 438/157 |
| 2007/0252199 | A1* | 11/2007 | Chung | H01L 29/66621 257/330 |

OTHER PUBLICATIONS

Orihara et al. "New Shunt Wiring Technologies for High Performance HDTV CCCD Image Sensors"; International Electron Devices Meeting, IEEE; pp. 105-108; Dec. 13, 1992.

* cited by examiner

SEMICONDUCTOR DEVICE AND METHOD OF MANUFACTURING SUCH SEMICONDUCTOR DEVICE

FIELD OF THE INVENTION

The invention relates to a semiconductor device comprising: a substrate comprising an insulating layer, wherein the electrically insulating layer comprises a recess, and a first conductive wire provided within the recess, wherein the first conductive wire comprises a first conductive sub-layer and a second conductive sub-layer provided on the first conductive sub-layer forming a shunt for the first conductive sub-layer. The invention further relates to a method of manufacturing such semiconductor device.

BACKGROUND ART

There are several application areas where on-chip charge transport in interconnect has become a severe problem. The more the feature sizes are reduced in integrated circuits (such feature size reduction is required in frame-transfer charge-coupled device (CCD) image sensors suitable for HDTV for example) the larger the RC-values. This puts severe challenges on the technology in which the IC is manufactured. Several improvements in the technology have been reported in order to tackle the problem of increasing RC-values.

For instance, H. L. Peek et al. "*Groove-fill of tungsten and poly-Si membrane technology for high performance (HDTV) FT-CCD imagers*", Proceedings of IEDM 93, p. 567-570, discloses several technology enabling the manufacturing of a HDTV Frame Transfer CCD sensor, being: 1) a groove-fill titanium-tungsten/tungsten shunt wiring technology, directly resulting in a planar surface; 2) non-overlapping poly-Si transfer gate method, and 3) very thin poly-Si gate-electrodes (membrane poly-gates technology). It is further disclosed that with these technologies a high-vertical frame-shift frequency of 2.5 MHz, a low-on-chip power dissipation of 560 mW, and a high sensitivity in general (especially in blue) has been fabricated successfully.

Nevertheless, the shunt-wiring technology as described above has faced its limits, and the charge transport speed still appeared to be a problem, because of the resistance of the Tungsten wires and the increase in resolution and speed requirements of large CCD's for Photogrammetry and Professional Photography.

U.S. Pat. No. 5,504,355 reports a solid stage image sensor device having an effective light detecting element and a peripheral circuit including a light shielding firm for shielding a periphery of the effective light detecting element, a first wiring film made of the same material as that of the light-shielding film and formed in the same process as that for the light-light-shielding film, and a second wiring film of aluminum for the peripheral circuit. The first wiring film and the second wiring film form a two-layer wiring structure of the peripheral circuit and are electrically interconnected through contact holes in an interlayer insulating film. With this arrangement, it is possible to lower the wiring resistance for the peripheral circuit and also to cause a signal transfer clock pulse of high-frequency to propagate without its waveform becoming dull.

KR20020059120A discloses a fabrication method of a CMOS image sensor, which is provided to minimize a contact resistance during metallization by maintaining a uniform contact resistance to each pixel. After forming a BPSG layer on a semiconductor substrate, a contact hole is formed by selectively etching the BPSG layer. An adhesive layer is formed on the resultant structure. A tungsten film and an aluminum metal wire are sequentially formed by CVD (chemical vapor deposition) so as to fill the contact hole.

SUMMARY OF THE INVENTION

Drawback of the known art is that none of the technologies provides an adequate solution to the charge transport problem. In any one of the known solutions either the packing density is consolidated (using more than 1 metal layer for the interconnecting wires) or the flat-topology is sacrificed, which is subsequently also detrimental to the fill factor, and the realization of color filters and micro-lenses.

One of the objects of the invention is to provide a semiconductor device, wherein the charge transport problem is improved, while ensuring a large packing density and a full flat-topology.

The invention is defined by the independent claims, the dependent claims define embodiments.

A first aspect of the invention provides a semiconductor device as claimed in claim 1.

A semiconductor device in accordance with the first aspect of the invention reaches several effects. First of all, it results in a flat topology, because both the first conductive sub-layer as well as the second conductive sub-layer are substantially planar and have substantially the same pattern. Furthermore, both sub-layers together form the first conductive wire, which is located substantially within the recess (at least the first conductive sub-layer is within the recess). Moreover, the fact that both sub-layers effectively form a single interconnect layer, ensures that more routing resources (namely the second metal layer) are available for other wires and the fill factor is improved as well (for example there is no overlap between intermediate wires/contacts and the gates). Tungsten is used for the first conductive sub-layer and provides excellent trench and via filling capacity. Aluminum is used for the second conductive sub-layer and effectively reduces the resistance of the conductive wire. The inventors have realized that this is the case even if the second conductive sub-layer is relatively thin, for example ¼th of the thickness of the first conductive sub-layer. A thin second-conductive sub-layer has a further advantage that the topology can be kept more planar more easily, and the compatibility with technologies without the second conductive sub-layer is substantially preserved.

In an embodiment of the semiconductor device in accordance with the invention a ratio (p) of the thickness (h1) of the second conductive sub-layer ( ) versus the thickness (h2) of the first conductive sub-layer ( ) lies in the range between 0.25 and 1, and preferably in the range between 0.4 and 0.8. This embodiment provides a good trade-off between wire resistance on the one side and technology planarity and compatibility on the other side.

An embodiment of the semiconductor device in accordance with the invention further comprises a further conductive wire at another location than the first conductive wire, wherein the insulating layer at the other location does not comprise a recess. The further conductive wire only comprises the second conductive sub-layer, and has been formed in the same step as the second conductive sub-layer of the first conductive wire. This is an advantageous embodiment, because a special low-capacitance track is obtained, which may be very beneficial for certain circuits, such as the first stage of the read-out amplifier in a CCD image sensor (low capacitance results in a better signal-to-noise ratio).

The capacitance of the further conductive wire is smaller, because of two reasons. First, it is located at a further distance from the substrate (due to the absence of the first conductive sub-layer), which reduces the bottom capacitance of the further conductive wire. Second, the thickness of the further conductive wire is smaller, which reduces the fringe capacitance and the lateral capacitance of the further conductive wire. With this embodiment the wire capacitance may be reduced up to a factor of 5. In a further embodiment even the width of this wire may be reduced, which reduces the bottom capacitance and thereby the total capacitance even further.

In an embodiment of the semiconductor device in accordance with the invention at least part of the further conductive wire is surrounded by an air gap for forming a bridge structure.

A second aspect of the invention provides an image sensor comprising the semiconductor device in accordance with the invention. The invention is very advantageous for image sensors (both CCD as well as CMOS image sensors) in particular high-speed and large size image sensors, because in such image sensors the RC-value requirements are the most stringent. The dependent claims define embodiments.

In an embodiment of the image sensor in accordance with the invention the image sensor is a CCD image sensor or a CMOS image sensor An embodiment of the image sensor in accordance with the invention comprises an image sensor array for capturing image data, a storage array coupled to the image sensor array for storing the image data, and a read-out circuit for reading out the image data from the storage array. The first conductive wire forms part of interconnections in the image sensor array and/or the storage array and in the periphery.

In an embodiment of the image sensor in accordance with the invention the further conductive wire forms part of an electrical connection in the read-out circuit for reducing the parasitic capacitance. The advantage of this embodiment is that the connecting wire at the input of the read-out out-circuit has a smaller capacitance, which is beneficial for the signal-to-noise ratio of such circuit.

A third aspect of the invention provides a method of manufacturing a semiconductor device. This method conveniently provides the semiconductor device in accordance with the invention. For the method of the invention and all its embodiments similar advantages and effects are obtained as for corresponding embodiments of the semiconductor device of the invention. Therefore such advantages and effects are not explicitly mentioned hereinafter.

In an embodiment of the method in accordance with the invention the step of providing the first conductive wire comprises:
 providing the first conductive sub-layer in the recess, and
 providing the second conductive sub-layer on the first conductive sub-layer.

In an embodiment of the method in accordance with the invention the step of providing the first conductive sub-layer comprises:
 forming a conformal adhesion layer on the substrate and in the recess;
 forming the first conductive sub-layer on the substrate and filling the recess, and
 performing an etch-back for removing excess material of the first conductive sub-layer outside the recess.

In an embodiment of the method in accordance with the invention the conformal adhesion layer comprises titanium and titanium nitride. In this embodiment part of the tungsten material in the recess may be removed as well, which forms an undeep cavity, but this is not essential. In case the etch-back is stopped in-time the undeep cavity is not or hardly formed.

In an embodiment of the method in accordance with the invention the step of providing the second conductive sub-layer comprises:
 forming an aluminum layer covering the substrate, and
 patterning the aluminum layer to form the second conductive sub-layer. The second conductive sub-layer may be partly in the recess (in case the undeep cavity was formed in an earlier step), but this is not essential as long as the second conductive sub-layer forms a shunt for the first conductive sub-layer).

In an embodiment of the method in accordance with the invention during the step of patterning the aluminum layer, also a further conductive sub-layer is formed at another location where there is no first conductive sub-layer present to obtain locally a further conductive wire that only comprises the aluminum layer.

An embodiment of the method in accordance with the invention further comprises a step of forming an air gap around the further conductive sub-layer for forming a bridge structure.

In an embodiment of the method in accordance with the invention the step of forming the air gap is carried out during a step of forming opening to bondpads by etching, during which step an opening is formed from a top side of the semiconductor device which extends to beyond the layer in which the further conductive layer is provided to obtain the bridge structure.

BRIEF DESCRIPTION OF THE DRAWINGS

These and other aspects of the invention are apparent from and will be elucidated with reference to the embodiments described hereinafter. In the drawings, FIG. 1 discloses a schematic layout of a CCD image sensor in accordance with the invention.

Figure 1:
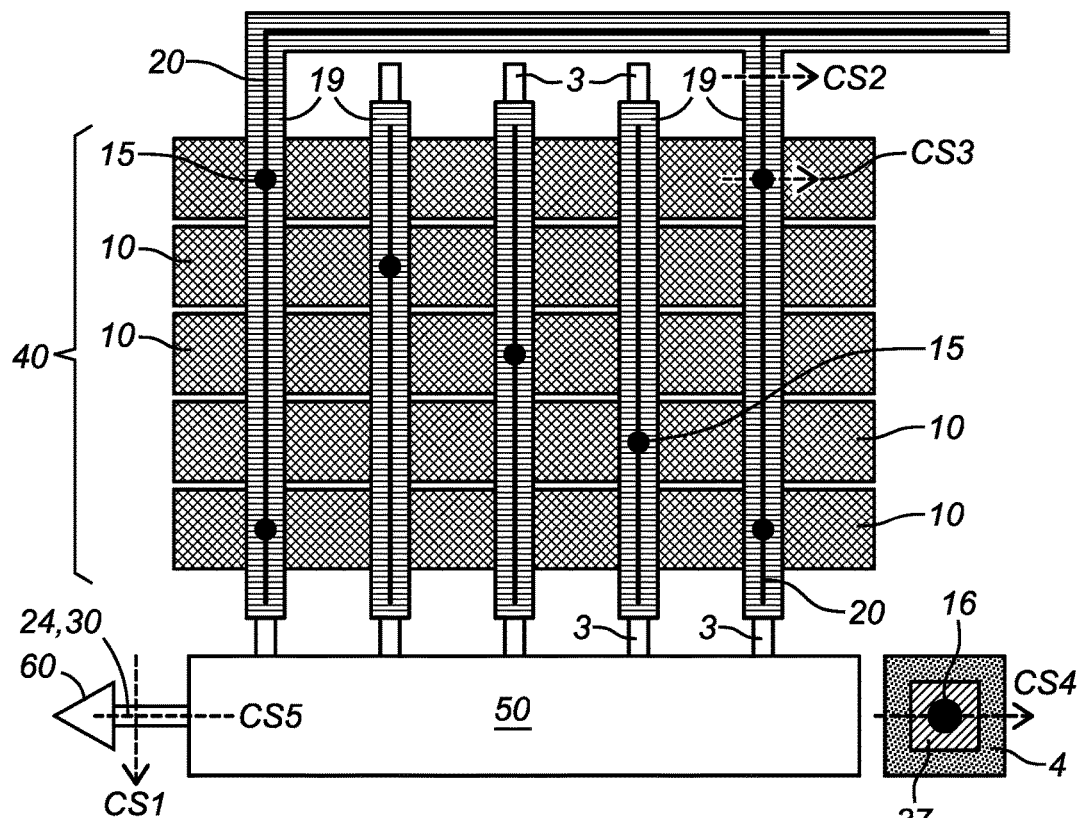

It should be noted that items, which have the same reference numbers in different Figures, have the same structural features and the same functions, or are the same signals. Where the function and/or structure of such an item has been explained, there is no necessity for repeated explanation thereof in the detailed description.

LIST OF REFERENCE NUMERALS 1 substrate
2 electrically insulating layer
3 channel stop region
4 N+ or P+-type diffusion region
5 (gate) dielectric
10 gates (poly-silicon)
15 shunt-to-gate contact (poly-silicon)
16 bondpad-to-diffusion contact (Tungsten)
19 etch-stop layer (poly-silicon)
20 dual-layer conductive wire (shunt-wire)
21 adhesion layer (conformal layer of Titanium (nitride))
22 first conductive sub-layer (Tungsten)
24 second conductive sub-layer (Aluminum)
25 insulating spacers
26 bridge structure
27 all-around airgap around bridge structure 26
28 silicon nitride layer (passivation layer)
30 low-capacitance conductive wire
36 Aluminum contact in periphery
37 Aluminum bondpad
40 part of image/storage section (part of sensor array/storage array)
50 read-out register
60 read-out amplifier
99 recess
101 conventional contact mask opening
101' deep contact mask opening
CS1 first cross-section
CS2 second cross-section
CS3 third cross-section
CS4 fourth cross-section
CS5 fifth cross-section
CS6 fifth cross-section
d depth of undeep cavity
SL other location (with special low-capacitance wire)

DETAILED DESCRIPTION OF EMBODIMENTS

Charge transport speed is still a problem in very large area image sensors. Solutions have been proposed in the past, but these solutions have reached their limits rendering it impossible to further increase image sensor resolution and speed. This invention proposes a planar double-metal shunt wiring technology, which may be used in image sensors (both CCD as well as CMOS). On top of existing Tungsten Shunt Wiring a second (relatively thin) metal layer of Aluminum is defined to decrease the resistance of the wiring. With very little impact on the releases of the "conventional" (CCD) technology, the resistance reduction may be up to a factor of 5. In an advantageous embodiment of the invention a further piece of interconnect may be simultaneously formed having a strongly reduced capacitance, i.e. up to a factor of 5. Such capacitance reduction may be very beneficial for the signal-to-noise ratio, when used in the interconnect between the output amplifier and the read-out register of a CCD image sensor.

Due to its planarity the double-metal shunt wiring technology of the invention is quite compatible with existing tungsten shunt technology used in CCD image sensors for example. The second metal sub-layer (Aluminum) has a much lower resistance than the first metal sub-layer (Tungsten). Fully replacing the tungsten with the Aluminum is not very feasible, because:

- a complete filling of narrow grooves (which a required in high-density high resolution image sensors) with Aluminum is not possible using the currently available process techniques;
- a direct contact between Aluminum and transfer gate material (poly-silicon in an image sensor) is very undesirable, because of material migration that may occur.

To facilitate the understanding of the scope of the invention and its variations, a few terms are defined hereinafter.

The term "substrate" may denote any suitable material, such as a semiconductor, glass, plastic, etc. According to an exemplary embodiment, the term "substrate" may be used to define generally the elements for layers that underlie and/or overlie a layer or a portion of interest. Also, the substrate may be any other base on which a layer is formed, for example a semiconductor wafer such as a silicon wafer or silicon chip. A semiconductor substrate may comprise a material of the group comprising: a group IV semiconductor (such as silicon or germanium), and a group III-group V compound semiconductor (such as gallium arsenide).

The term "semiconductor device" may denote a transistor or a circuit comprising a plurality of transistors and interconnections. The transistor may be a field effect transistor for example.

The term "field effect transistor" (FET) may denote a transistor in which an output current (source-drain current) may be controlled by the voltage applied to a gate. Such FET structure may be an MOSFET. The semiconductor device can be any integrated circuit and may comprise logic circuitry, photo sensitive cells, memory cells, and the like. The material of the semiconductor structure may be silicon, germanium, or any other semiconductor material.

As the invention is related towards technology rather than circuits the following description of the drawings does not elaborate in much detail on the operation of CCD and CMOS imagers. Such knowledge is considered to be known to the person skilled in the art.

Figure 2A:
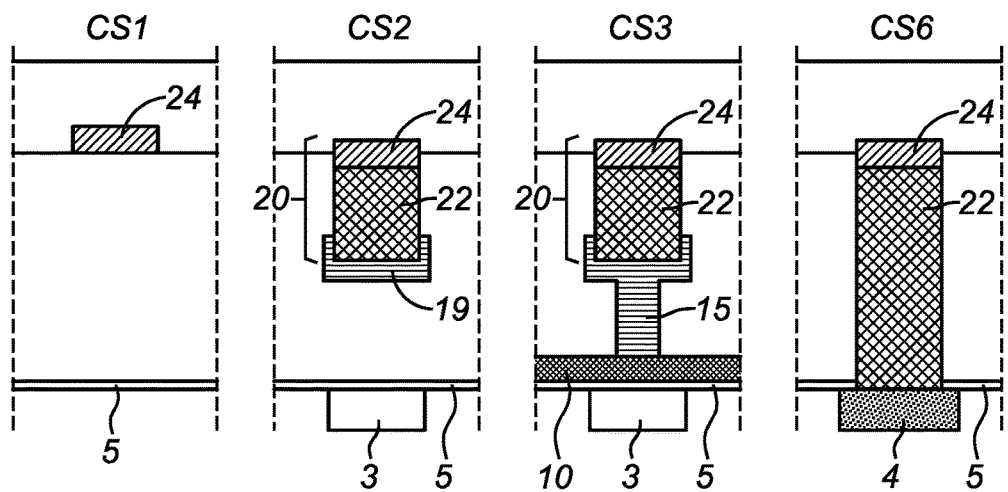
FIGS. 2a and 2b disclose schematic cross-sections of the CCD image sensor of FIG. 1.
Figure 2B:
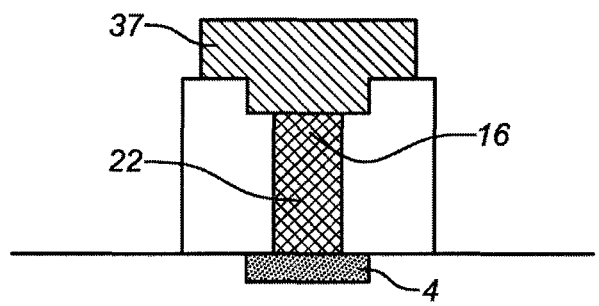

FIG. 1 discloses a schematic layout of a CCD image sensor in accordance with the invention. It must be noted that FIG. 1 has been significantly simplified in order to facilitate the understanding. FIGS. 2a and 2b disclose schematic cross-sections of the CCD image sensor of FIG. 1. The CCD image sensor comprises an array of photo-sensitive cells (not shown) forming a sensor array 40 (in fact the Figure discloses part of image/storage section, which have similar CCD cells, and therefore only one array is drawn). Columns of photo-sensitive cells are isolated by respective CCD channel stop regions 3, which extend from the top of the sensor array 40 to the bottom of the sensory array 40. Conventionally, the CCD channel stop regions 3 comprise P+-conductivity type material. For the manufacturing boron ions may be implanted with a dose of 5E15 $cm^{-2}$ for example. The channel stop region 3 separates the respective CCD channels and should be as narrow as possible. So the width of the poly-Si etch stop layer and the double-shunt wiring above should not be wider than the width of the channel stop region. It determines the fill factor of the CCD pixel.

A plurality of transfer gates 10, comprising poly-silicon for example, run over the photo-sensitive cells. In the drawings only 5 transfer gates are drawn, but this is for simplicity reasons only. These transfer gates 10 are used for transporting collected charge in respective photo-sensitive cells towards a read-out register 50. This is done by applying clock signals to the respective transfer gates, wherein the clock signals are having shifted clock phases. Conventional CCD image sensors may have 2-phase, 3-phase, 4-phase, or 8-phase clocks, but other numbers are also possible. In FIG. 1 a 4-phase clock is illustrated, i.e., the first transfer gate has the same clock signal as the fifth transfer gate, the second transfer gate has the same clock signal as the sixth transfer gate, and so on. The respective transfer gates 10 are connected together using shunt-wires 20 (in FIG. 1 these shunt-wires are schematically drawn by means of solid black lines). In order to reduce the transfer gate resistance, the shunt-wires 20 are placed multiple times. In order to illustrate this repetition in FIG. 1 the first transfer gate and the fifth transfer gate are provided with two shunt wires 20. A realistic CCD image sensor array 40 is much larger and there each clock phase has multiple shunt wires 20. In FIG. 1 also a read-out amplifier 60 is shown which is coupled with its input to the output of the read-out register 50. The read-out register 50 has generally a similar structure as the image sensor array 40, albeit 90 degrees rotated, i.e. in operational use the read-out register 50 shifts its charge towards the left in FIG. 1 (towards the read-out amplifier 60). In frame transfer CCD image sensors half of the cell array (in FIG. 1 the upper half) is configured for receiving images, while the other half (in FIG. 1 the lower half) is used as a storage array. The latter is generally covered with a light shield (i.e. the same aluminum that is used in the periphery interconnection) to prevent light to reach the cells in that area, such that they can be used as storage area (structurally such cells are the same FIG. 1 further discloses a bondpad 37 comprising Aluminum, which has been schematically illustrated outside the read-out register 50 and the array 40. A CCD sensor generally comprises a plurality of such bondpads 37 which are providing electrical connections to the circuitry. In the example illustrated the bondpad 37 is provided above a diffusion region 4. Furthermore, a bondpad-to-diffusion contact 16 schematically illustrated.

FIGS. 2a and 2b disclose more details of the wiring technology in the embodiment of FIG. 1. In FIG. 2a it is shown that the shunt-wires 20 are dual-layer conductive wires. With dual-layer it is meant that the conductive wires 20 comprise a first conductive sub-layer 22 and second conductive sub-layer 24 provided on top of the first conductive sub-layer 22. The first conductive sub-layer 22 comprises Tungsten and the second conductive sub-layer 24 comprises Aluminum. Below the first conductive sub-layer 22 there is an etch-stop layer 19. Such etch-stop layer 19 may comprise poly-silicon for example and enhances the manufacturability of the device. However, such etch-stop layer is not essential to the invention (it may be left out). Moreover, poly-silicon has a rather high resistivity, which has a negative impact on the performance of the device (larger RC times).

The connections between the shunt-wires 20 and the respective transfer gates 10 are made using shunt-to-gate contacts 15. Various options exist to manufacture such contacts 15, one of them being to etch a contact hole before depositing the etch stop layer 19. In such process a structure is created as illustrated in FIG. 2a, wherein the contact comprises the same material as the etch-stop layer 19, i.e. poly-silicon in this example. In FIG. 2a there is also shown a gate dielectric 5 (for example silicon oxide) between the substrate and the gate 10. Such gate dielectric may also be present at other locations, where there is no gate (as drawn in FIG. 2a), but this is not essential (it may be subsequently removed elsewhere).

FIG. 2a shows four cross-sections of which the locations are illustrated in FIG. 1. The first cross-section CS1 is at the location of a special low-capacitance conductive wire 30 between the read-out register 50 and the read-out amplifier 60. The second cross-section CS2 is through the shunt-wire 20 at a location where there is no transfer gate 10 underneath the shunt-wire 20. The third cross-section CS3 is at the location of the shunt-wire 20 where it is connected to the respective transfer gate 10 via the shunt-to-gate contact 15. FIG. 2b illustrates a fourth cross-section CS4 through the bondpad 37 of FIG. 1. FIG. 1 also shows a fifth cross-section CS5 at the location of the special low-capacitance conductive wire 30. The fifth cross-section is in a length direction of this wire. This cross-section will be explained while discussing FIGS. 8 to 11. FIG. 2a further discloses a sixth cross-section CS6. The sixth cross-section CS6 is at the location of a contact to a diffusion region 4, for instance outside the read-out register 50, contacting the silicon substrate. Both the shunt-wire 20 as well as the contact in the sixth cross-section CS6 comprise the Tungsten sub-layer 22 as well as the Aluminum sub-layer 24. Because of its lower resistivity the Aluminum sub-layer 24 significantly reduces the resistance of the shunt-wire, which is beneficial for the charge transport (lower RC-value). More information on the method of manufacturing of the dual-layer wire technology is given in the description of FIGS. 4 to 7. From that description it is made clear that the invention opens up the possibility of a very advantageous embodiment, namely an embodiment with the earlier-mentioned special low-capacitance conductive wire 30. This special low-capacitance wire 30 only comprises the second conductive sub-layer 24, which comprises Aluminum (see the first cross-section CS1).

Figure 3:
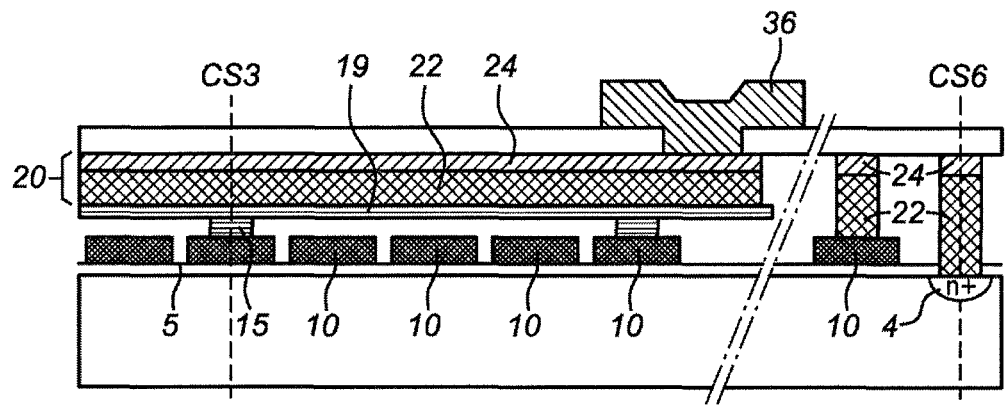
FIG. 3 discloses a further cross-section of a CCD image sensor in accordance with the invention.

FIG. 3 discloses a further cross-section of a CCD image sensor in accordance with the invention. The left part of this cross-section is through a shunt wire 20 in a length direction thereof. Same parts are visible as in FIGS. 1 and 2 plus a shunt contact 36, which may be made of Aluminum for example. The right part of this cross-section illustrated a different type of contact to the gate 10 without the etch stop layer 19 (in fact the gate 10 then acts as an etch stop layer) and the sixth cross-section CS6.

Figure 4:
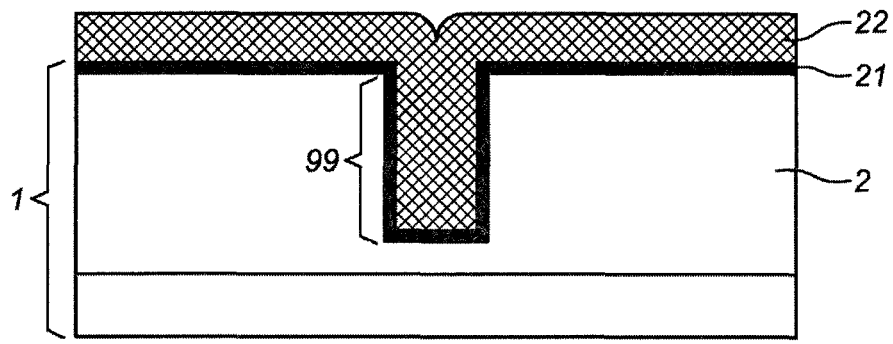
FIGS. 4 to 7 disclose different stages of a method of manufacturing a semiconductor device in accordance with the invention.

FIGS. 4 to 7 disclose different stages of a method of manufacturing a semiconductor device in accordance with the invention. In the method of the invention a substrate 1 with a recess 99 in an electrically insulating layer 2 is provided. The substrate 1 may comprise circuitry and interconnect, but for simplicity reasons these parts are not shown. Subsequently, an adhesion layer 21 in the form of a conformal layer of Titanium (Ti) and Titanium nitride (TiN) is deposited (using sputter deposition for example) on the substrate 1 and in the trench 99. The Titanium sub-layer in the adhesion layer 21 ensures a low contact resistance and the Titanium nitride layer acts as a barrier layer. However, other materials are also possible. In a further step Tungsten material 22 (for the first conductive sub-layer) is deposited covering the substrate 1 and filling the trench 99. This stage is illustrated in FIG. 4.

Figure 5:
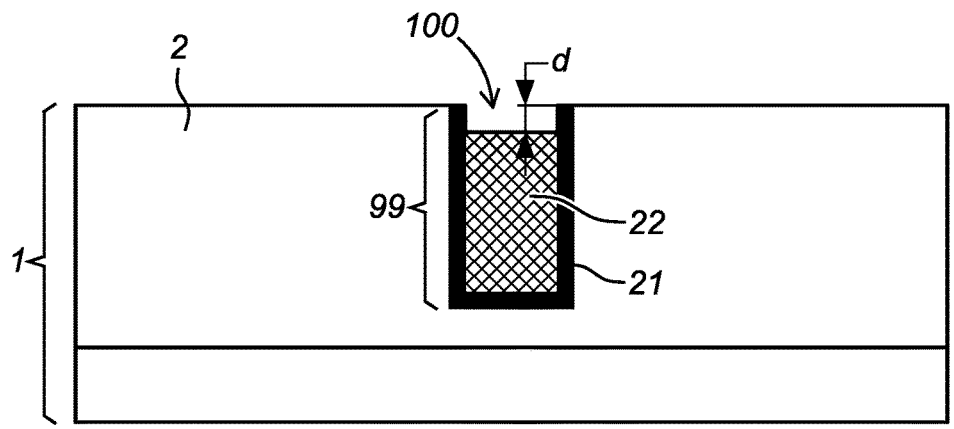

In a further step an etch-back (using conventional processing techniques) is performed, wherein excess Tungsten material 22 and the adhesion layer 21 are removed outside the trench. Under certain conditions, and in particular during the etch-back, an undeep cavity 100 is formed in the top of the trench 99, due to an over etch to be sure no tungsten shorts will remain. The depth d may be typically 0.1 µm to 0.2 µm. This stage is illustrated in FIG. 5.

Figure 6:
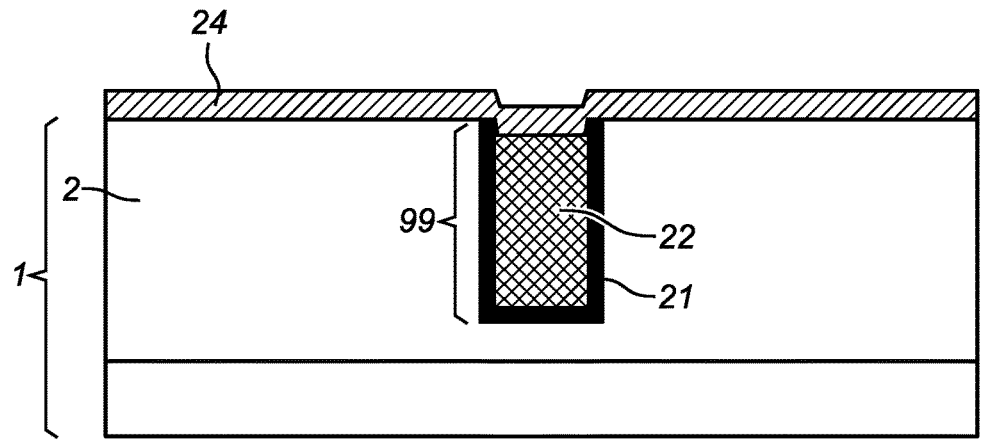
Figure 7:
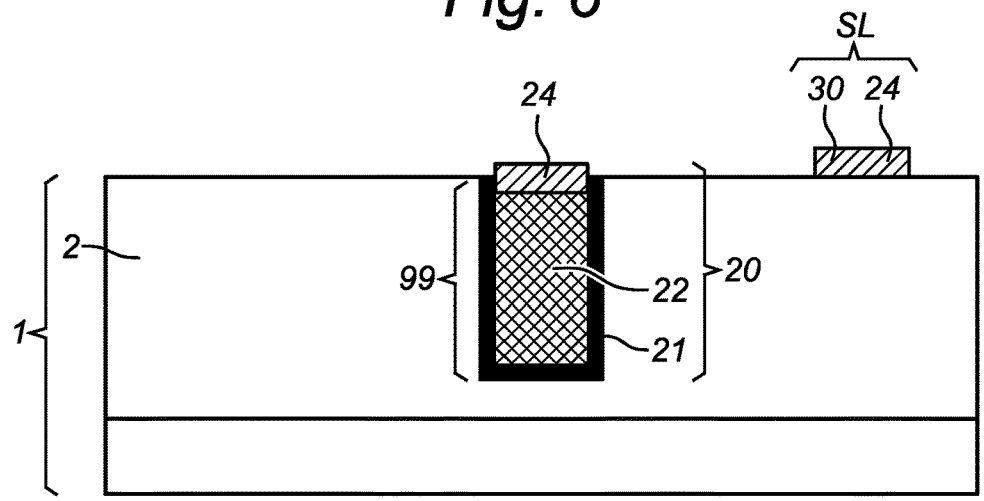

In a further step the second conductive sub-layer material 24, i.e. Aluminum, is deposited. The thickness may be chosen in the order of 0.2 µm to 0.3 µm for example. While doing so, the topography hardly changes, which is beneficial when the wiring technology of the invention has to replace a conventional Tungsten wiring technology. The resulting structure is shown in FIG. 6.

In a further step the Aluminum layer 24 is patterned (using conventional processing techniques), such that a dual-layer shunt wire 20 is formed. In the very same step of patterning the Aluminum layer the earlier-mentioned low-capacitance conductive wire 30 may be formed at another location (where there is no recess and tungsten). As a result the low-capacitance conductive wire 30 only comprises the second conductive sub-layer 24 (Aluminum). This low-capacitance conductive wire 30 may be advantageously used in many locations in an integrated circuit. In a CCD image sensor the interconnecting wire between the read-out register 50 and the read-out amplifier 60 may be implemented using this special wire technology. This is illustrated in FIGS. 8 to 12. Another important remarks is that the width of the aluminum layer 24 may be chosen the same or different to the width of the tungsten layer. For the low-capacitance conductive wire 30 the width may be chosen smaller (within the limits of the technology concerned, i.e. the minimum feature size) in order to reduce the capacitance even more.

Figure 8:
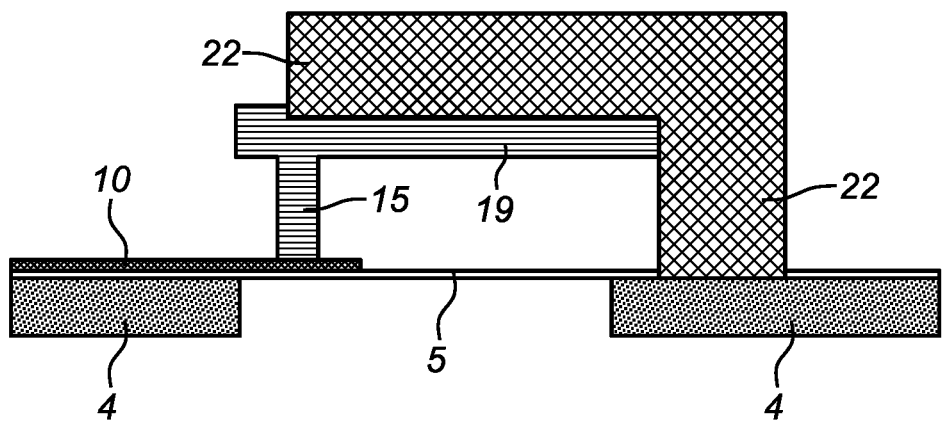
FIG. 8 discloses a cross-section at location CS5 in FIG. 1 in accordance with the prior art solution.

FIG. 8 discloses a cross-section at location CS5 in FIG. 1 in accordance with the prior art solution. On the left side there is the gate of the first stage (source follower) of the read-out amplifier 60 and on the right side there is the diffusion of the output of the read-out register 50. The interconnecting wire comprises an etch stop layer 19 as well as a Tungsten layer 22.

Figure 9:
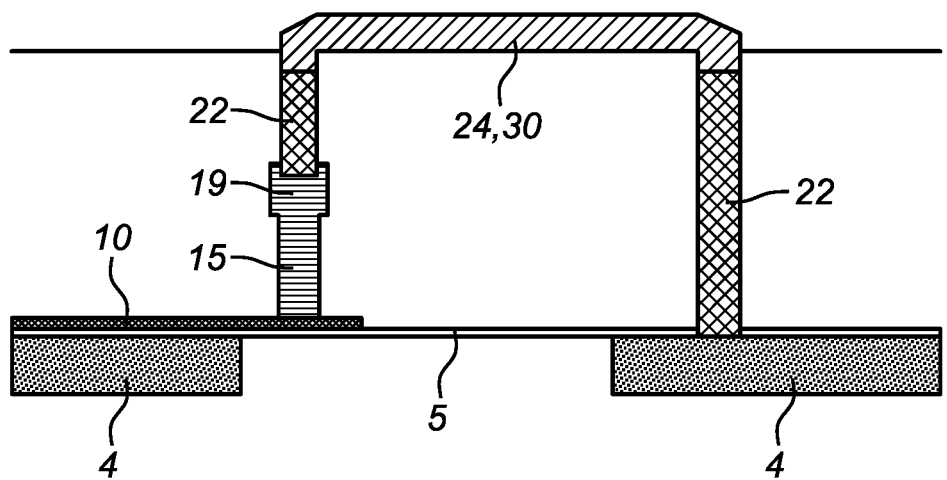
FIG. 9 discloses a cross-section at location CS5 in FIG. 1 in accordance with an embodiment of the invention.

FIG. 9 discloses a cross-section at location CS5 in FIG. 1 in accordance with an embodiment of the invention. In this case the interconnecting wire 30 only comprises the second conductive sub-layer 24. At the location of the respective contacts hole may be etched such that a Tungsten plug 22 is formed there. Also, at the location of the amplifier stage respective etch stop layers and plugs may be made, similar to FIG. 2. The consequence of the wiring technology of the invention is that the interconnecting wire 30 is located further away from the substrate, and more over the wire is much thinner and narrower than that of FIG. 8. This strongly reduces the capacitance of the wire. The advantage of this embodiment is that the signal-to-noise ratio of the CCD amplifier is strongly increased.

Figure 10:
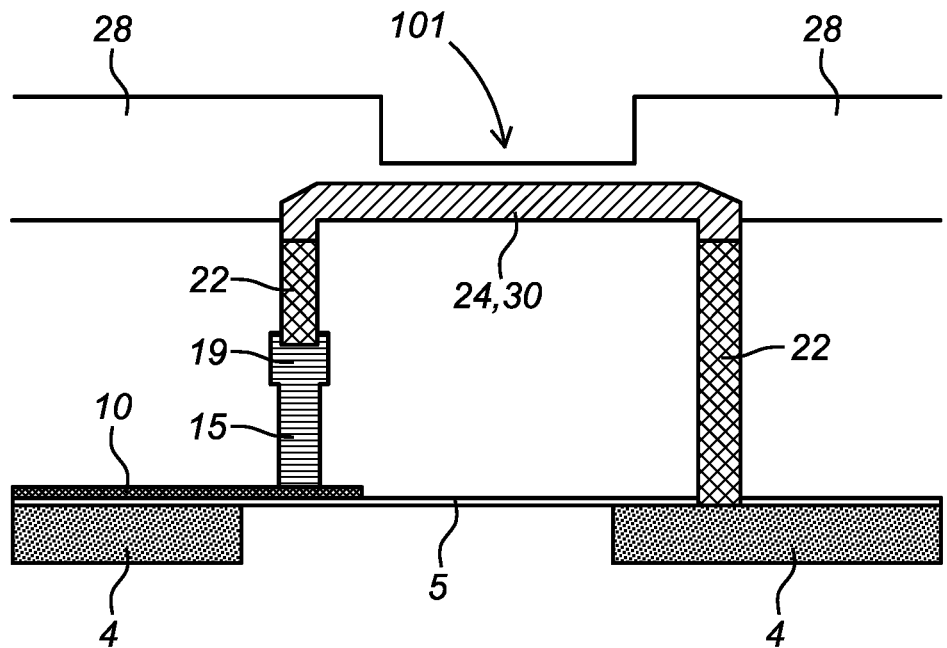
FIG. 10 discloses respective cross-sections at location CS5 in FIG. 1 in accordance with yet another embodiment of the invention.

FIG. 10 discloses respective cross-sections at location CS5 in FIG. 1 in accordance with yet another embodiment of the invention. This advantageous embodiment is obtained without any additional step. During the process step in which contact openings are made to the bondpads (not shown) also an opening is made towards the low-capacitance wire 30. Typically the contact openings are made through a silicon nitride layer (passivation layer) 28. Once the bondpads are reached the etching is stopped and thus a conventional contact mask opening 101 is obtained at the location of the low-capacitance conductive wire 30. This step reduces the capacitance of the conductive wire 30 even further, because silicon nitride has a larger k-value than air, and the amount of silicon nitride material around the conductive wire is reduced by the etching step.

Figure 11:
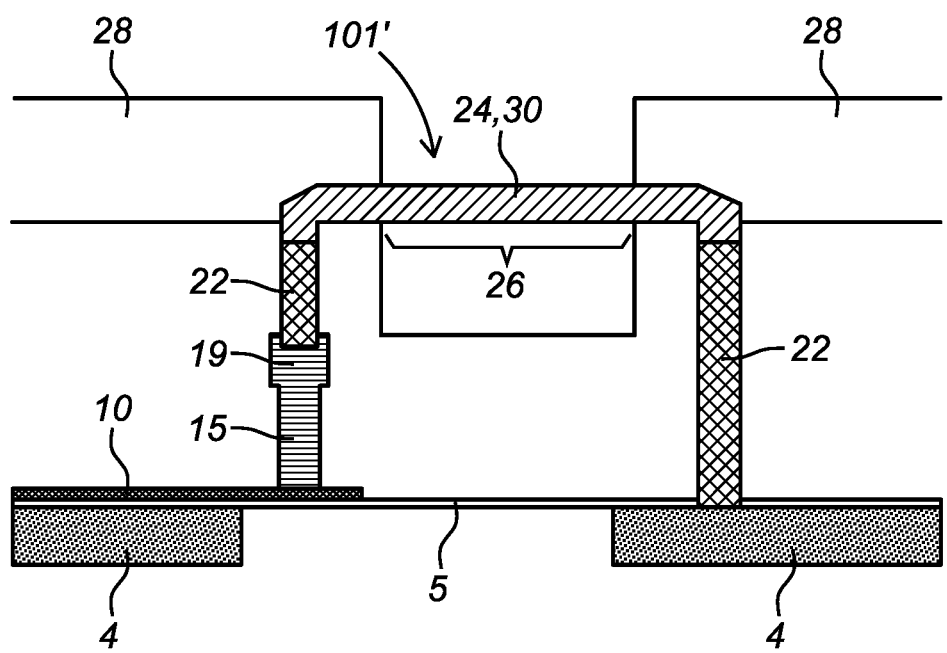
FIG. 11 discloses respective cross-sections at location CS5 in FIG. 1 in accordance with yet another embodiment of the invention.
Figure 12:
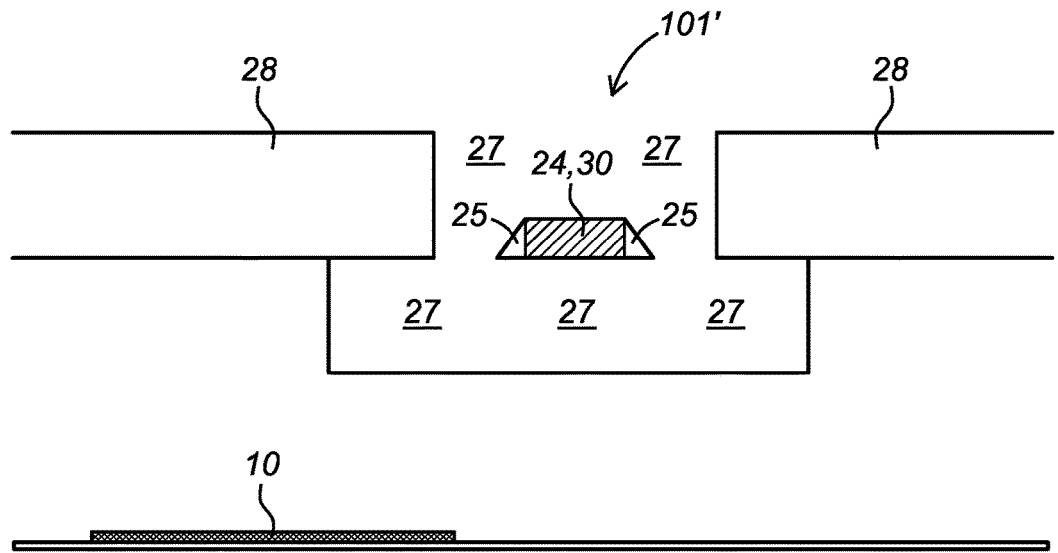
FIG. 12 discloses a cross-section at location CS1 in FIG. 1 of the embodiment of FIG. 11, and FIG. 13 discloses several curves indicating the resistance of the dual-layer in dependence of the design parameters.

FIG. 11 discloses respective cross-sections at location CS5 in FIG. 1 in accordance with yet another embodiment of the invention. FIG. 12 discloses a cross-section at location CS1 in FIG. 1 of the embodiment of FIG. 11. In this embodiment an extra masking step is required in order to etch a deep contact mask opening 101', which extends around and beyond the conductive wire 30, i.e. an all-around airgap 27 has been obtained relatively easily. The additional mask is required to protect the bondpads against the deep etching step. As can be seen in FIG. 11 a bridge structure 26 is obtained, wherein the structure comprises the second conductive sub-layer 24 as well as insulating spacers 25 (consisting of the silicon nitride material). With the embodiment of FIGS. 11 and 12 a capacitance reduction up to a factor of 5 may be obtained.

Figure 13:
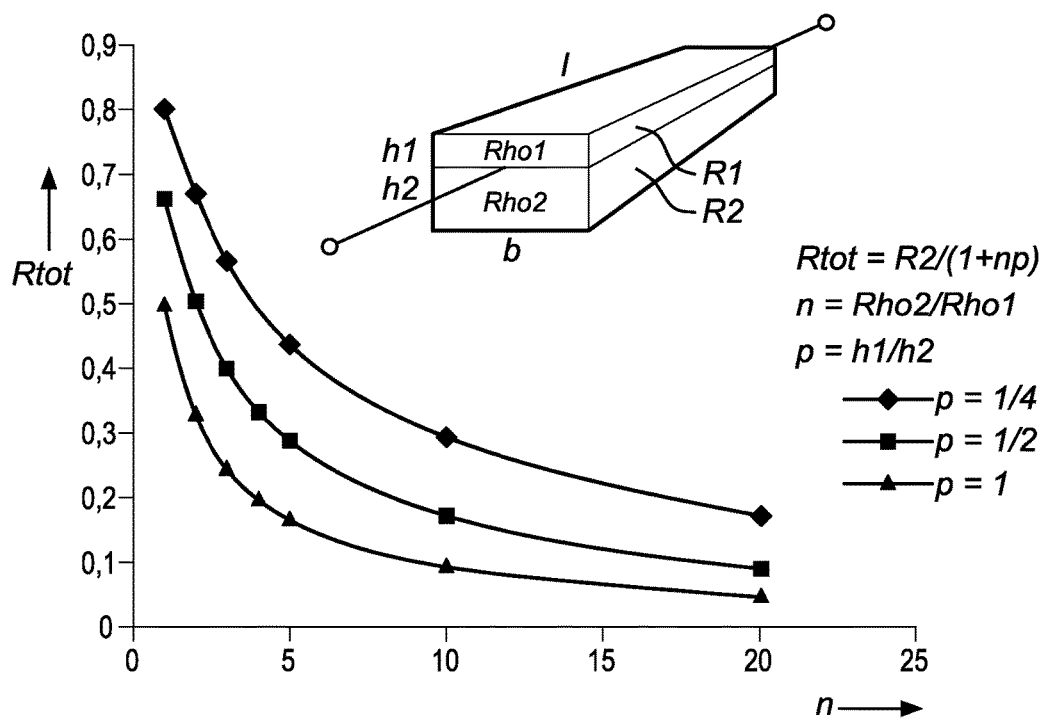

FIG. 13 discloses several curves indicating the resistance of the dual-layer in dependence of the design parameters. The curves provide a very generic dependency of the resistance on the various parameters. The thickness ratio p is defined as the thickness h1 of the upper layer (the second conductive sub-layer 24) divided by the thickness h2 of the lower layer (the first conductive sub-layer 22). The resistance ratio n is defined as the resistivity Rho1 of the upper layer (the second conductive sub-layer 24) divided by the resistivity Rho2 of the lower layer (the first conductive sub-layer 22). In case Tungsten is used for the lower layer and Aluminum for the upper layer the ratio n is around 4. Point of departure when studying FIG. 13 is that the trenches (for the conductive wires to be formed) have to be as narrow as possible, whereas these trenches still have to be filled with Tungsten. In FIG. 13, it can be seen which second metal could be choses and with what thickness for significant reduction of the resistance without disturbing the internal structure of the image sensor (changing the layout, etc). Possible metals are Gold (Au), Silver (Ag), Copper, and Aluminum. From a resistance point-of-view Silver would be the best choice (lowest resistance). However, such metal is "forbidden" in CCD and MOS fabs. Moreover, Gold and Silver are too expensive to be an attractive option. Copper has the disadvantage that it needs to be properly encapsulated, before being allowed in a CCD and MOS fab, which would complicate the manufacturing method significantly. Aluminum is the most attractive metal as it has the best overall "performance" in terms of meeting all requirements.

It is clear from the above description that the interconnect technology of the invention is not limited to CCD image sensors, albeit that such image sensor clearly benefits from the invention. The invention is also applicable to CMOS image sensors, because also in those image sensors the interconnecting wires tend to become longer as the image sensor sizes increases, while at the same time speed requirements go up as well. The invention may be further used in any other application where Tungsten interconnect technology is used. Such Tungsten interconnect is then replaced with the dual-layer interconnect of the invention, while the topology of the technology is hardly affected.

It should be noted that the above-mentioned embodiments illustrate rather than limit the invention, and that those skilled in the art will be able to design many alternative embodiments.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A method of manufacturing a semiconductor device, the method comprising:
   providing a substrate (1) comprising an electrically insulating layer (2), wherein the electrically insulating layer (2) has a recess (99); and
   providing a conductive wire (20) that includes:
      a first conductive sub-layer (22) that is made from tungsten and is in the recess (99), and
      a second conductive sub-layer (24) that is made from aluminum which reduces a resistance of the conductive wire (20) and that completely overlaps and is directly on a top surface of the first conductive sub-layer, a horizontal width of the second conductive sub-layer being completely within a confines of a horizontal width of the first conductive sub-layer (22), the second conductive sub-layer (24) forming a shunt for the first conductive sub-layer (22), the first conductive sub-layer (22) and the second conductive sub-layer (24) being planar.

2. The method of claim 1, wherein providing the conductive wire (20) comprises:
   providing the first conductive sub-layer (22) in the recess (99); and
   providing the second conductive sub-layer (24) on the first conductive sub-layer (22).

3. The method of claim 2, wherein providing the first conductive sub-layer (22) comprises:
   forming a conformal adhesion layer (21) on the substrate (1) and in the recess (99);
   forming the first conductive sub-layer (22) on the substrate (1) and filling the recess (99); and
   performing an etch-back for removing excess material of the first conductive sub-layer (22) outside the recess (99).

4. The method of claim 2, wherein providing the second conductive sub-layer (24) comprises:
   forming an aluminum layer covering the substrate (1); and
   patterning the aluminum layer to form the second conductive sub-layer (24).

5. The method of claim 4, wherein during patterning of the aluminum layer (24), a further conductive sub-layer (24) is formed at another location (SL) where there is no first conductive sub-layer (22) present to obtain locally a further conductive wire (30) that only comprises the aluminum layer (24).

6. The method of claim 5, further comprising forming an air gap (27) around the further conductive sub-layer (24) for forming a bridge structure.

7. The method of claim 6, wherein forming the air gap (27) is carried out during forming of an opening to bond pads by etching, during which the opening (101, 101') is formed from a top side of the semiconductor device which extends to or beyond the layer in which the further conductive layer (24) is provided to obtain the bridge structure (26).

* * * * *